United States Patent [19]

Matsuda et al.

[11] Patent Number: 5,770,514
[45] Date of Patent: Jun. 23, 1998

[54] METHOD FOR MANUFACTURING A VERTICAL TRANSISTOR HAVING A TRENCH GATE

[75] Inventors: Noboru Matsuda, Kawasaki; Yoshiro Baba, Yokohama; Satoshi Yanagiya, Kawasaki; Masanobu Tsuchitani, Tokyo, all of Japan

[73] Assignee: Kabushiki Kaisha Toshiba, Kawasaki, Japan

[21] Appl. No.: 787,573

[22] Filed: Jan. 22, 1997

Related U.S. Application Data

[62] Division of Ser. No. 449,578, May 24, 1995, abandoned.

[30] Foreign Application Priority Data

May 30, 1994 [JP] Japan ................................. 6-117050

[51] Int. Cl.$^6$ ................... H01L 21/3205; H01L 21/4763
[52] U.S. Cl. .......................................... 438/589; 438/268
[58] Field of Search .................................. 438/585, 589, 438/268

[56] References Cited

U.S. PATENT DOCUMENTS

| | | |
|---|---|---|
| 4,327,476 | 5/1982 | Iwai et al. . |
| 4,455,740 | 6/1984 | Iwai . |
| 5,016,067 | 5/1991 | Mori ........................................ 257/330 |
| 5,108,938 | 4/1992 | Solomon . |
| 5,312,782 | 5/1994 | Miyazawa ............................. 257/330 |
| 5,326,711 | 7/1994 | Malhi . |
| 5,378,914 | 1/1995 | Ohzu et al. ............................. 257/330 |

FOREIGN PATENT DOCUMENTS

| | | | |
|---|---|---|---|
| 0017371 | 1/1992 | Japan | 257/330 |

*Primary Examiner*—John Niebling
*Assistant Examiner*—Richard A. Booth
*Attorney, Agent, or Firm*—Finnegan, Henderson, Farabow, Garrett & Dunner, L.L.P.

[57] ABSTRACT

In a vertical field effect transistor having a trench gate and a method of manufacturing the same according to the present invention, p-type base and n$^+$-type source diffusion layers are formed in this order in a surface region of an n$^{31}$-type epitaxial layer on an n$^+$-type semiconductor substrate. A trench is then provided to such a depth as to penetrate the diffusion layers. A dope polysilicon layer is deposited and buried into the trench with a gate insulation film interposed between them. The polysilicon layer is etched to have the same level as that of the entrance of the trench, and a dope polysilicon layer 18 is selectively grown thereon, thereby forming a trench gate in which an upper corner portion of the trench is not covered with a gate electrode. Consequently, the concentration of electric fields at the corner portion can be mitigated thereby to increase an absolute withstand voltage of the gate and the variations in threshold voltage can be suppressed in a BT test.

1 Claim, 5 Drawing Sheets

METHOD FOR MANUFACTURING A VERTICAL TRANSISTOR HAVING A TRENCH GATE

This application is a division, of application Ser. No. 08/449,578 filed May 24, 1995, now abandoned.

BACKGROUND OF THE INVENTION

1. Field of the Invention

The present invention relates to a transistor having at least one insulated gate and a method of manufacturing the same and, more specifically, to a transistor capable of preventing a gate insulation film from decreasing in withstand voltage owing to an electric field locally concentrated on the insulation film and a method of manufacturing the same.

2. Description of the Related Art

Vertical field effect transistors (U-MOS FET) have recently attracted attention as next-generation semiconductor devices having a high driving capacity and capable of improving a high degree of integration in a small area on a substrate.

Figure 1:
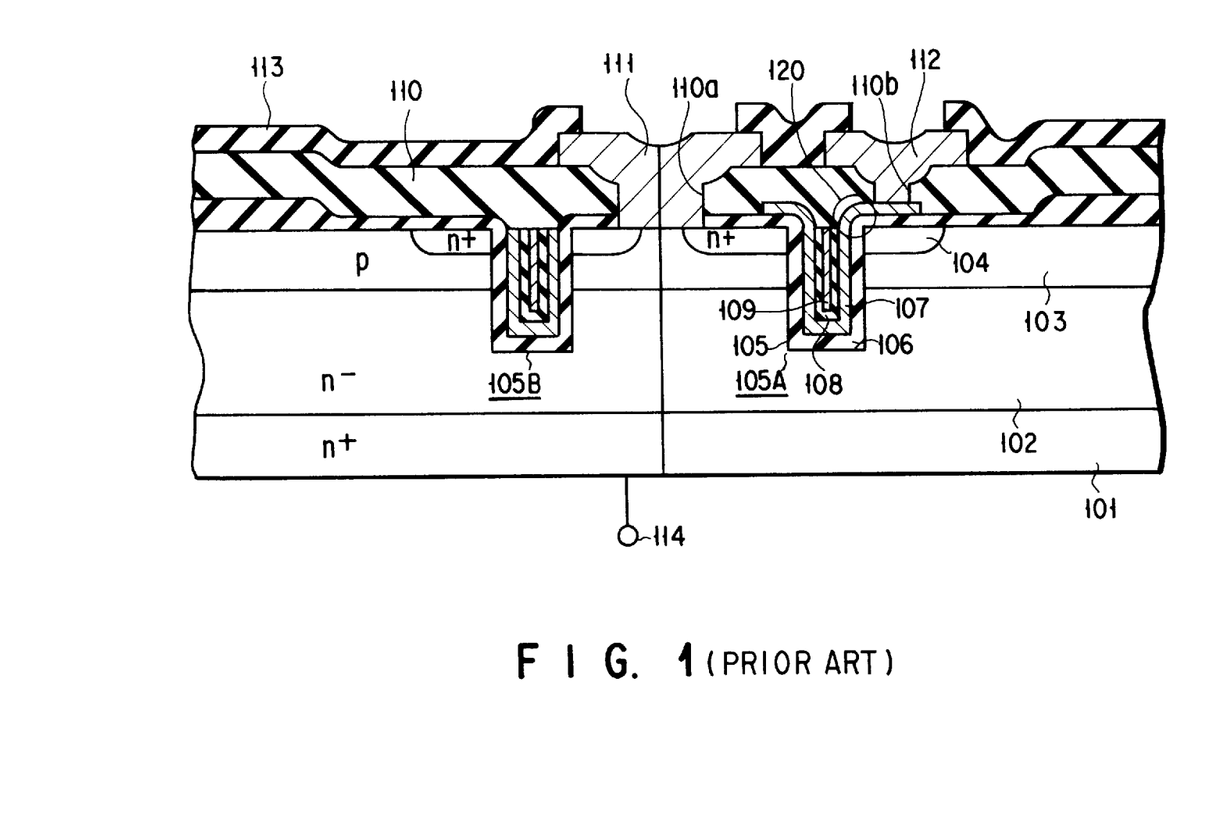
FIG. 1 is a schematic cross-sectional view of a vertical field electric transistor for explaining prior art and its problems.

FIG. 1 is a cross-sectional view schematically showing the constitution of a prior art vertical electric field transistor. In FIG. 1, the right- and left-hand views are taken at different positions of the transistor.

As illustrated in FIG. 1, an $n^-$-type epitaxial layer 102 is formed on an $n^+$-type semiconductor substrate 101, a p-type base diffusion layer 103 is formed in a surface region of the epitaxial layer 102, and $n^+$-type source diffusion layers 104 are formed in a surface region of the diffusion layer 103. Trenches 105 are formed in parallel to each other so as to reach the layer 102 through the base diffusion layer 103 and source diffusion layer 104. A first polysilicon layer 107 serving as a gate electrode, is buried into each of the trenches 105 with a gate oxide film 106 interposed therebetween, and a second polysilicon layer 109 is buried into the layer 107 with an oxide film 108 interposed therebetween. The gate oxide film 106 is formed on the surface of the epitaxial layer 102 including the diffusion layers 103 and 104.

In trench gate 105A shown in FIG. 1, the first polysilicon layer 107 is formed on the film 106 and extends outside the trench 105. Furthermore, a CVD (Chemical Vapour Deposition) film 110 is deposited all over the gate oxide film 106, and openings 110a and 110b are formed in this film 110 to contact the base diffusion layer 103, source diffusion layer 104 and first polysilicon layer 107. These openings 110a and 110b are formed by etching, e.g., using a lithography technique. A source electrode 111 is formed, using metal such as aluminum, to communicate with the diffusion layers 103 and 104, and a gate lead-out electrode 112 is formed to communicate with the layer 107.

A passivation film 113 is formed so as to cover all the surface of the CVD film 110 except the electrodes 111 and 112. In the vertical field effect transistor so constructed, a drain electrode 114 is provided alongside the semiconductor substrate 101.

Though not shown in FIG. 1, a polysilicon layer 107 of trench gate 105B is extended outside a trench 105 and partially connected to a gate lead-out electrode 112 at the same position as that of the section of the trench gate 105A.

FIGS. 2A to 2D show in detail a process of providing a trench gate (a buried gate electrode) in the foregoing prior art vertical electric field transistor.

Figure 2A:
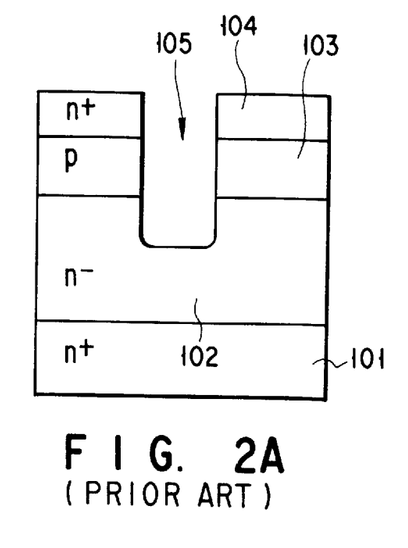
FIGS. 2A to 2D are schematic cross-sectional views showing a process of forming a trench gate of the vertical field effect transistor shown in FIG. 1.

First, a double diffusion layer, including a p-type base diffusion layer 103 and an n+-type source diffusion layer 104, is formed in a surface region of an $n^-$-type epitaxial layer 102 on an $n^+$-type semiconductor substrate 101, and then a trench 105 is formed by anisotropic etching such as RIE (Reactive Ion Etching), using a CVD film (not shown) as a mask. (FIG. 2A)

Figure 2B:
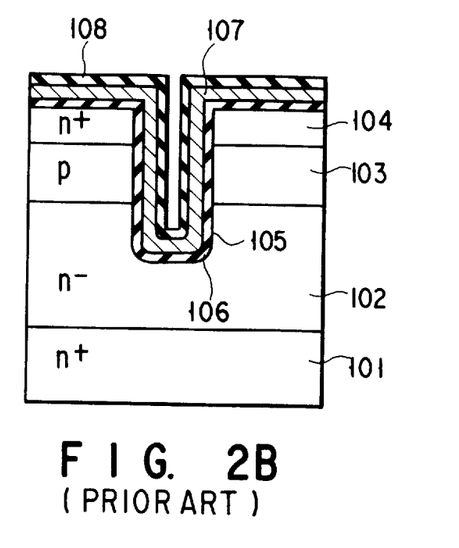

After that, a gate oxide film 106 is formed on the trench 105, and a first polysilicon layer 107 is deposited thereon by low pressure CVD or the like. If the layer 107 is selectively removed from the trench 105 and uniformly doped with n-type impurities, it is rendered conductive. An oxide film 108 is uniformly formed on the layer 107. (FIG. 2B)

Figure 2C:
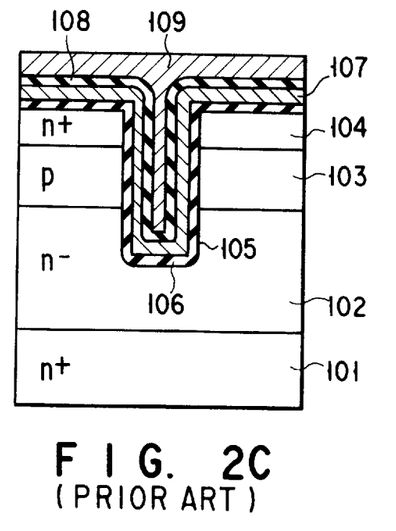

A second polysilicon layer 109 is deposited on the oxide film 108 by, for example, the low pressure CVD, with the result that the trench 105 is filled with the film and layer. (FIG. 2C)

Figure 2D:
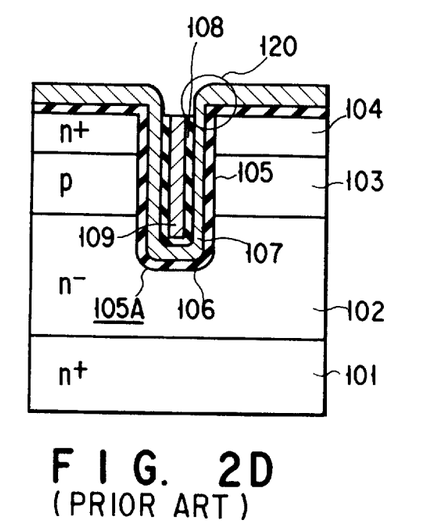

An upper portion of the second polysilicon layer 109 is etched back by CDE (Chemical Dry Etching) or the like, and the oxide film 108 is etched using a solution such as BHF (bromide hydrogen fluoride). (FIG. 2D)

Furthermore, the first polysilicon layer 107 is patterned by RIE or the like to have a predetermined shape, with the result that the layer 107 covers an upper corner portion 120 of the trench 105 and serves as a gate electrode (trench gate).

However, the vertical field effect transport including the trench gate described above has the following problem. Since the transistor is so constructed that the first polysilicon layer 107 covers the upper corner portion 120 of the trench 105, an electric field is concentrated on the corner portion 120 to thereby decrease the withstand voltage of the gate. Since, furthermore, the electric field is increased at portion 120 of the trench 105, variations in threshold voltage (Vth) are accelerated when a BT (Bias & Temperature) Test is carried out.

SUMMARY OF THE INVENTION

An object of the present invention is to provide a transistor having at least one insulated gate which is capable of preventing an electric field from being concentrated locally, increasing an absolute withstand voltage and suppressing a variation in threshold voltage in a BT test, and a method of manufacturing the same.

According to a first aspect of the present invention, there is provided a transistor having at least one insulated gate, comprising:

a semiconductor layer including an impurity diffusing layer through which a groove is formed; and a gate layer buried into the groove with an insulation film interposed therebetween, and having a width which is smaller than that of the groove.

According to a second aspect of the present invention, there is provided a transistor having at least one insulated gate, comprising:

a semiconductor substrate of a first conductivity type through which a groove is formed;

a first semiconductor layer of a second conductivity type provided in a surface region of the semiconductor substrate through which the groove is formed;

a second semiconductor layer of the first conductivity type provided in a surface region of the first semiconductor layer through which the groove is formed;

a gate insulation film formed along an inner wall of the groove; and a gate layer buried in the groove with the gate insulation film interposed therebetween, and having a width which is smaller than that of the groove, the gate layer protruding from an entrance of the groove.

According to a third aspect of the present invention, there is provided a transistor having at least one insulated gate, comprising:

a semiconductor substrate of a first conductivity type through which a groove is formed;

a first semiconductor layer of a second conductivity type provided in a surface region of said semiconductor substrate through which the groove is formed;

a second semiconductor layer of the first conductivity type provided in a surface region of said first semiconductor layer through which the groove is formed;

a gate insulation film formed along an inner wall of the groove;

a gate layer buried in said grooves with said gate insulation film interposed therebetween, and having a width which is smaller than that of said groove, said gate layer protruding from an entrance of said groove; and a third semiconductor layer of the second conductivity type provided on an undersurface of said semiconductor substrate of the first conductivity type.

According to a fourth aspect of the present invention, there is provided a method of manufacturing a transistor having at least one insulated gate, comprising the steps of:

providing a groove portion in part of an element region formed on a semiconductor substrate, the groove portion penetrating an impurity diffusing layer; and providing a gate layer in the groove portion with an insulation film interposed therebetween, the gate layer having a width which is smaller than that of the groove portion.

According to a fifth aspect of the present invention, there is provided a method of manufacturing a transistor having at least one insulated gate, comprising the steps of:

providing a first semiconductor layer of a second conductivity type in a surface region of a semiconductor substrate of a first conductivity type;

selectively providing a second semiconductor layer of the first conductivity type in a surface region of the first semiconductor layer;

providing trenches in parallel to each other to such a depth as to penetrate the second semiconductor layer and the first semiconductor layer;

providing a gate insulation film along an inner wall of each of the trenches; and providing a gate layer in each of the trenches with the gate insulation film interposed therebetween, and having a width which is smaller than that of each of the trenches, the gate layer protruding from an entrance of each of the trenches.

According to the above constitution of the present invention, since the gate electrode does not cover the upper corner portion of the trench, the insulation film can be prevented from being locally damaged by a concentrated electric field.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

DETAILED DESCRIPTION OF THE PREFERRED EMBODIMENTS

Embodiments of the present invention will now be described, with reference to the accompanying drawings.

Figure 3:
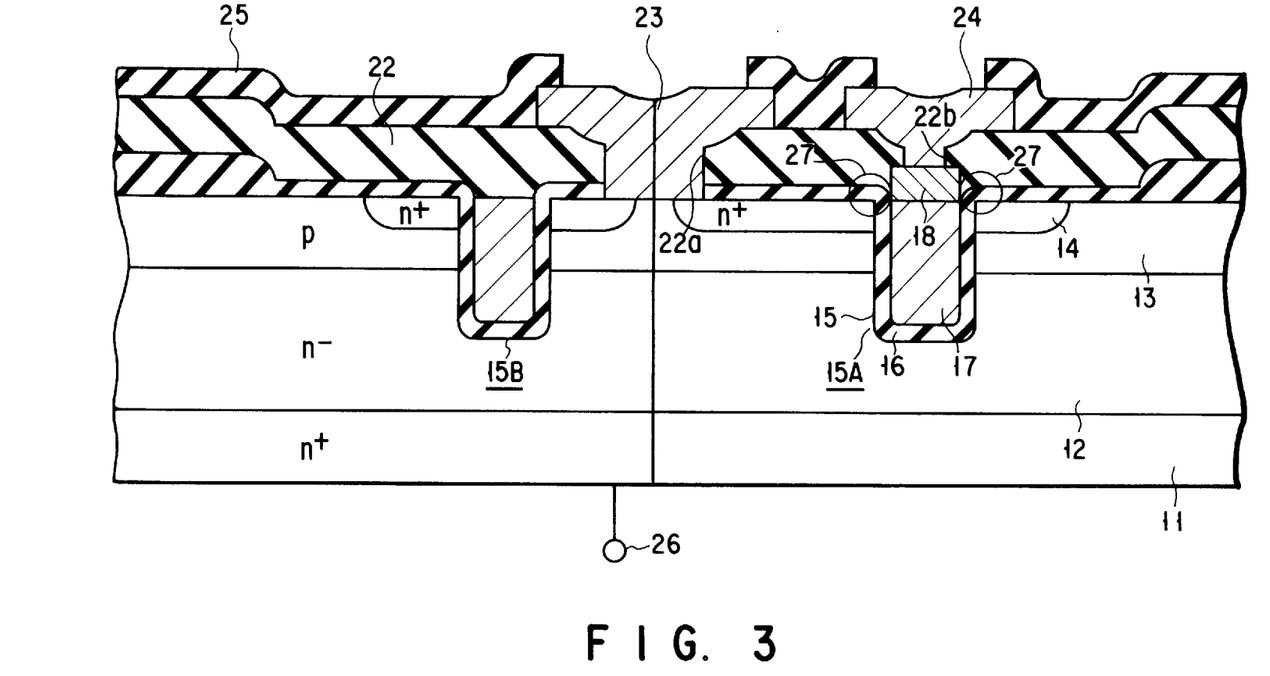
FIG. 3 is a schematic cross-sectional view of a vertical field effect transistor according to an embodiment of the present invention.

FIG. 3 schematically shows a vertical field effect transistor according to an embodiment of the present invention. FIG. 3 includes two sections one of which shows a trench gate 15A at a connecting portion between the trench gate and its lead-out electrode and the other of which shows another trench gate 15B at a portion other than the connecting portion.

As illustrated in FIG. 3, in the trench gates 15A and 15B, an n$^-$-type epitaxial layer 12 is formed on an n$^+$-type (first conductivity type) semiconductor substrate 11, a p-type base diffusion layer 13 (first semiconductor layer of second conductivity type) is formed in a surface region of the epitaxial layer 12, and n$^+$-type source diffusion layers 14 (second semi-conductor layers of the first conductivity type) are formed in a surface region of the diffusion layer 13. Trenches (groove portions) 15 are formed in parallel to each other so as to reach the layer 12 through the base diffusion layer 13 and respective source diffusion layer 14.

In the trench gate 15A, a polysilicon layer (first layer) 17 serving as a gate electrode, is buried into the trench 15 with a gate oxide film (insulating film) 16 interposed therebetween, and another polysilicon layer (second layer) 18 for drawing a gate electrode, is provided on the polysilicon layer 17 with a width narrower than that of the trench 15. The gate oxide film 16 is formed all over the surface of the epitaxial layer 12 including the diffusion layers 13 and 14. The polysilicon layer 18 is formed so as to project from above the trench 15.

Furthermore, a CVD (Chemical Vapour Deposition) film 22 is deposited all over the gate oxide film 16, and openings 22a and 22b are formed in this film 22 to contact the base and source diffusion layers 13 and 14 and polysilicon layer 18. A source electrode 23 is formed, using metal such as aluminum, to communicate with the layers 13 and 14, and a gate lead-out electrode 24 is formed to communicate with the layer 18.

A passivation (SiNx) film 25 is formed so as to cover all the surface of the CVD film 22 except the electrodes 23 and 24. In the vertical field effect transistor so constructed, a drain electrode 26 is provided alongside the semiconductor substrate 11.

Though not shown in FIG. 3, a polysilicon layer 17 of the trench gate 15B is partially connected to a gate lead-out electrode 24 through a polysilicon layer 18 at the same position as that of the section of the trench gate 15A.

According to the transistor described above, a trench gate (buried gate electrode) is so constructed that neither of the polysilicon layers 17 and 18 covers upper corner portions 27 of the trench 15. In other words, the trench gate is constituted of, for example, the polysilicon layer 17 buried into the trench 15 and the polysilicon layer 18 formed thereon.

A process of forming the trench gate of the foregoing vertical field effect transistor, will now be described.

Figure 4A:
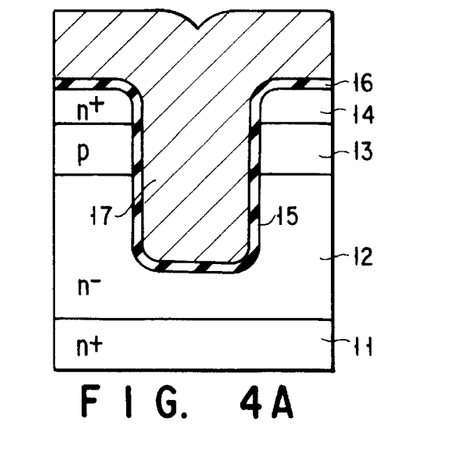
FIGS. 4A to 4C are schematic cross-sectional views showing a process of forming a trench gate of the vertical field effect transistor shown in FIG. 3.

First, as illustrated in FIG. 4A, a double diffusion layer, including a p-type base diffusion layer 13 and an n$^+$-type source diffusion layer 14, is formed in a surface region of an n$^-$-type epitaxial layer 12 on an n$^+$-type semiconductor substrate 11. For example, the thickness of the base diffusion layer 13 is about 2.0 μm in its depth direction, and that of the source diffusion layer 14 is about 0.5 μm in its depth direction.

A trench 15 is then formed by anisotropic etching such as RIE, using a CVD film (not shown) as a mask. The trench 15 reaches the epitaxial layer 12 through the source and base diffusion layers 14 and 13. The depth of the trench 15 is, e.g., 2.5 to 3.0 μm.

After that, a gate oxide film 16 having a thickness of about 500 Å is formed of ONO or the like on the trench 15, and a polysilicon layer 17 is deposited thereon by low pressure CVD or the like, with the result that the trench 15 is filled with the polysilicon layer 17. The layer 17 is previously doped with n-type impurities such as phosphorus to be conductive.

Figure 4B:
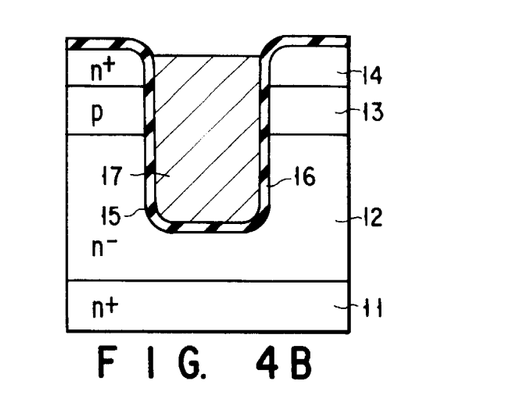

Subsequently, as shown in FIG. 4B, the polysilicon layer 17 is etched back by CDE (Chemical Dry Etching) or the like to the same level as the surface of the source diffusion layer 14, that is, the layer 17 is to substantially the same level as the entrance of the trench 15.

Figure 4C:
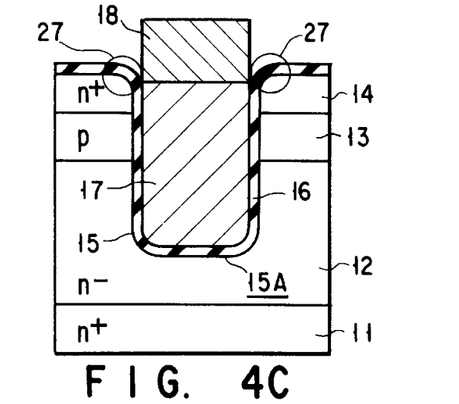

As shown in FIG. 4C, a polysilicon layer 18 doped with n-type impurities beforehand is selectively grown on the polysilicon layer 17 buried in the trench 15 by, e.g., epitaxial growth. The layer 18 protrudes from the trench 15 and it is narrower than the width (about 1 μm) of the trench 15. The polysilicon layers 17 and 18 thus constitute a trench gate 15A which does not cover the upper corner portions of the trench 15.

After the trench gate is so constituted, a CVD film 22 is deposited on the entire surface of the resultant structure and etched by lithography to form openings 22a and 22b contacting the base and source diffusion layers 13 and 14 and polysilicon layer 18. Source and gate lead-out electrodes 23 and 24 are formed in the openings 22a and 22b, respectively, using metal such as aluminum, and a passivation film 25 is formed on all the surface of the resultant structure except the electrodes 23 and 24. As a result, a vertical field effect transistor having a drain electrode 26 alongside the substrate 11, is completed.

According to the vertical field effect transistor having the above constitution, since neither of the corner portions 27 is covered with the polysilicon layers 17 and 18, the concentration of electric field can be lessened at the portions.

As described above, the doped polysilicon layer 17 is buried to the same level as the entrance of the trench 15 and extended outside through the doped polysilicon layer 18 which protrudes from the trench 15 and is narrower than the width of the trench 15. With this constitution, no electrodes are formed at the corner portions 27, and the concentration of electric field can be mitigated at the corner portions. Since, therefore, the gate oxide film 16 can be protected from a breakdown, the insulation properties of the gate oxide film 16 can be improved at the corner portions 27, and a sufficiently high absolute withstanding voltage (e.g., 20V of gate withstanding voltage in a 60V type vertical field effect transistor) can easily be maintained.

The mitigation of local concentration of electric field inhibits variations in threshold value in a BT test which are due to an increase in electric field at the corner portions 27.

The present invention is not limited to the above embodiment. For example, the gate lead-out electrode 24 can be formed directly on the polysilicon layer 17 without interposing the polysilicon layer 18 between them (not shown).

Figure 5A:
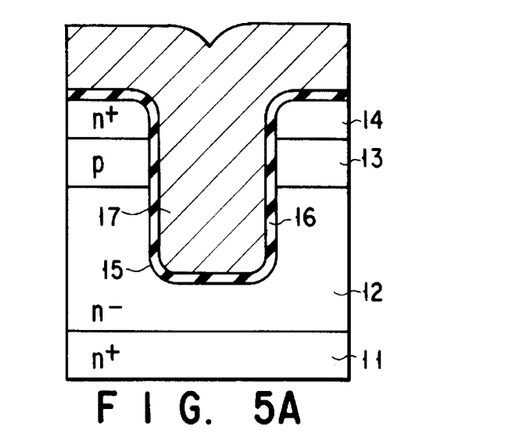
FIGS. 5A to 5C are schematic cross-sectional views showing another process of forming the trench gate of the vertical field effect transistor shown in FIG. 3.
Figure 5B:
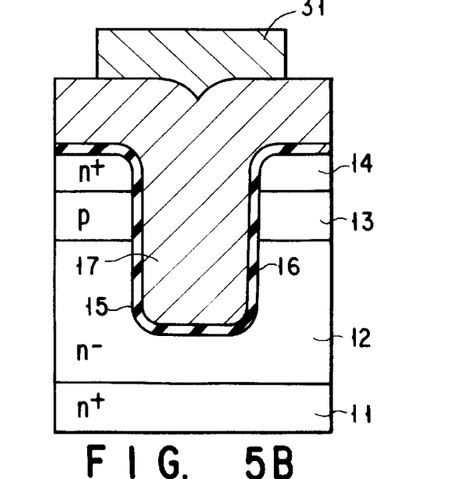
Figure 5C:
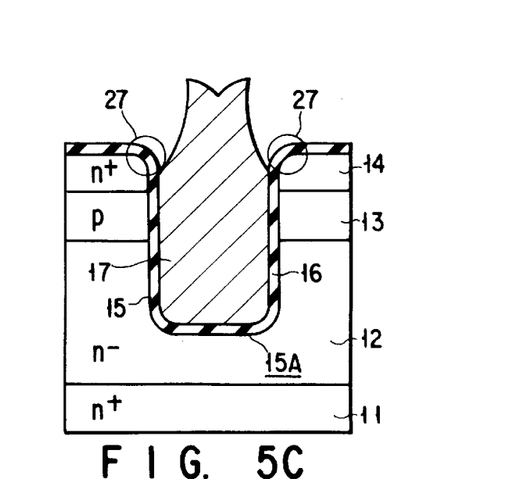

Moreover, the polysilicon layers 17 and 18 can be formed integrally as one component. FIGS. 5A to 5C show a process of forming the above two polysilicon layers integrally with each other to obtain a trench gate.

For example, a trench 15 is formed on the semiconductor substrate 11, and then a polysilicon layer 17 is uniformly deposited on the trench by low pressure CVD, with a gate oxide film 16 interposed therebetween. The layer 17 is etched using a resist 31, which is formed in correspondence with the trench 15, as a mask. By doing so, the layer 17 is buried into the trench 15 and protruded from the trench 15, and its width is smaller than that of the trench.

In this case, the resist 31 is slightly wider than the trench 15 in consideration of a shift in position from the trench. For example, isotropic etching is performed using the resist as a mask. The etching amount of polysilicon layer 17 buried into the trench 15 is so controlled that the layer 17 does not cover the corner portions 27.

The polysilicon layer 17 directly contacts a gate lead-out electrode 24 through an opening 22b formed in a CVD film 22.

Figure 6:
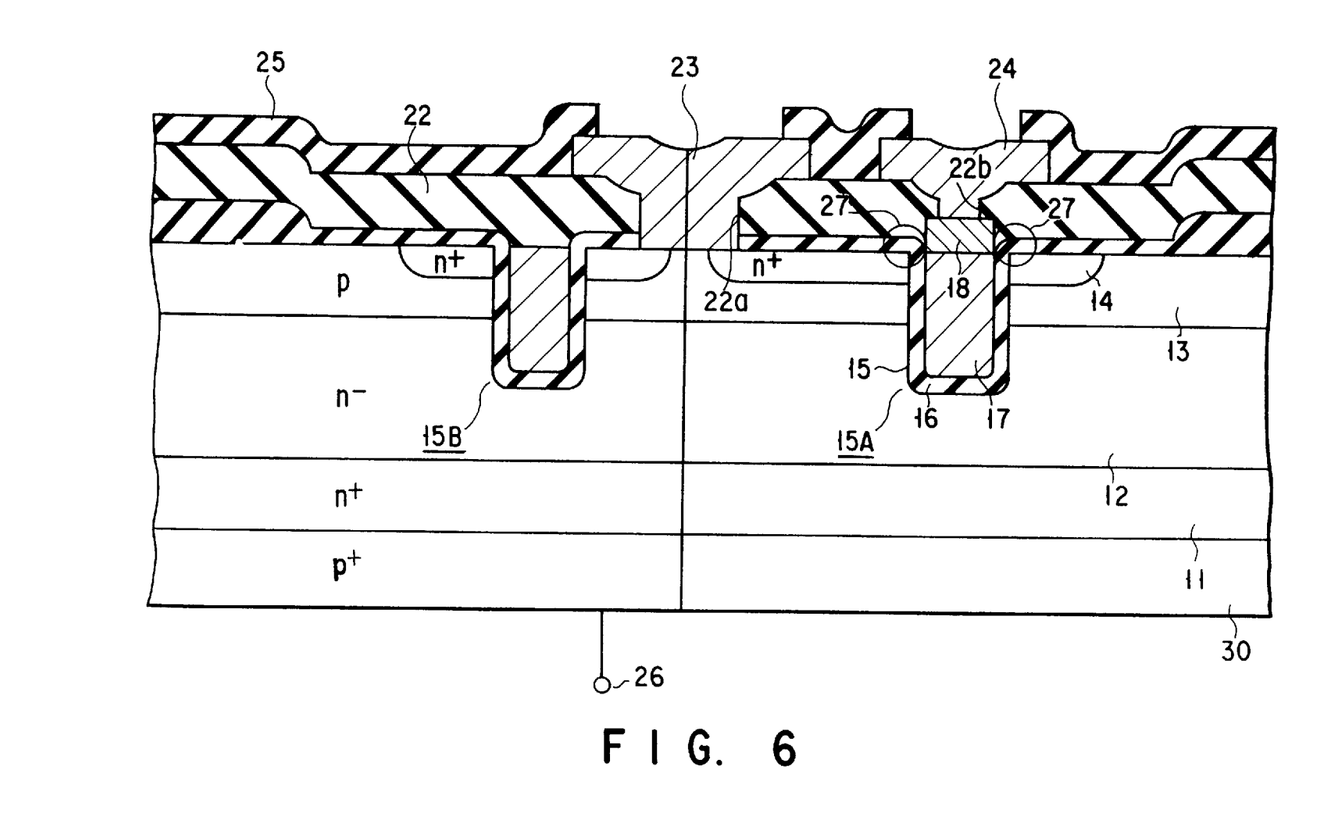
FIG. 6 is a schematic cross-sectional view of an IGBT (insulated gate bipolar transistor) according to another embodiment of the present invention.

The present invention is not limited to the vertical field effect transistor. It can be applied to an IGBT (insulated gate bipolar transistor) having the constitution as shown in FIG. 6. Since the IGBT differs from the U-MOS FET only in that a semiconductor layer 30 of the second conductivity type is formed between the semiconductor substrate 11 and drain electrode 26 of the U-MOS FET shown in FIG. 3, its detailed descriptions are omitted.

It is needless to say that various changes and modifications can be made without departing from the scope of the subject matter of the present invention.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A method of manufacturing a transistor having at least one insulated gate, comprising the steps of:

providing a groove portion in part of an element region formed on a semiconductor substrate, said groove portion penetrating an impurity diffusing layer;

providing a gate layer in said groove portion with an insulation film interposed therebetween, said gate layer having a width which is smaller than that of said groove portion; and wherein said gate layer is provided by selectively growing a polysilicon layer having impurities by epitaxial growth on a polysilicon layer having impurities which is buried into said groove portion to substantially the same level as an entrance of said groove portion.

* * * * *

UNITED STATES PATENT AND TRADEMARK OFFICE
CERTIFICATE OF CORRECTION

PATENT NO.   : 5,770,514
DATED        : June 23, 1998
INVENTOR(S)  : Noboru MATSUDA et al.

It is certified that error appears in the above-indentified patent and that said Letters Patent is hereby corrected as shown below:

Title Page, Item [57], in the Abstract, line 4, "$n^{31}$" should read --n--.

Signed and Sealed this

Twenty-second Day of June, 1999

Attest:

Q. TODD DICKINSON

*Attesting Officer*    *Acting Commissioner of Patents and Trademarks*